United States Patent

[11] 3,619,734

[72] Inventors Jacques Mayer Assour
Princeton, N.J.;
Arye Rosen, Elkins Park, Pa.

[21] Appl. No. 885,757
[22] Filed Dec. 17, 1969
[45] Patented Nov. 9, 1971
[73] Assignee RCA Corporation

[54] ASSEMBLY OF SERIES CONNECTED SEMICONDUCTOR ELEMENTS HAVING GOOD HEAT DISSIPATION
8 Claims, 4 Drawing Figs.

[52] U.S. Cl. .......... 317/234 R, 317/235 R, 317/234 A, 317/234 G, 317/234 H, 317/234 J, 317/234 N, 174/52
[51] Int. Cl. .......... H01l 3/00, H01l 5/00
[50] Field of Search .......... 317/234, 235, 1, 4, 4.1, 5, 5.4, 100, 101; 174/52

[56] References Cited

UNITED STATES PATENTS

| | | | |
|---|---|---|---|
| 3,265,802 | 8/1966 | Hillman et al. | 317/234 |
| 3,365,620 | 1/1968 | Butler et al. | 317/234 |
| 3,449,640 | 6/1969 | Franklin | 317/235 |
| 3,469,148 | 9/1969 | Lund | 317/234 |
| 3,483,308 | 12/1969 | Wakely | 317/234 |
| 3,519,888 | 7/1970 | Parrish | 317/234 |

OTHER REFERENCES

IBM Technical Bulletin, Semiconductor Device Package, by Gow; Vol. 5 No. 12 May. 1963 page 10. Copy in Group 253, class 317/234/5.

*Primary Examiner*—John W. Huckert
*Assistant Examiner*—Andrew J. James
*Attorney*—Glenn H. Bruestle

ABSTRACT: A high power semiconductor device comprising a housing having an enclosed chamber therein and a plurality of semiconductor elements mounted in the chamber and electrically connected in series. The semiconductor elements are individually mounted in spaced relation on a plate of an electrically insulating material which is a good conductor of heat and are electrically connected between a metal body secured to one side of the plate and a metal cover secured to the other side of the plate.

INVENTORS
JACQUES M. ASSOUR &
BY ARYE ROSEN
Donald S. Cohen
Attorney

ASSEMBLY OF SERIES CONNECTED SEMICONDUCTOR ELEMENTS HAVING GOOD HEAT DISSIPATION

BACKGROUND OF INVENTION

The present invention relates to a high power semiconductor device, and more particularly to an assembly of a plurality of semiconductor elements to obtain efficient high power operation of the assembly.

There has been developed certain semiconductor elements, such as avalanche diodes, which operate at high powers. It has been found that the powers can be greatly amplified by connecting a plurality of such semiconductor elements in series. However, problems have arisen in the assembly of a plurality of the semiconductor elements as a single device. It is desirable that the assembly be small in size and easy to fabricate. In addition, the assembled device must be capable of dissipating a considerable amount of heat. In use, the high power semiconductor elements generate heat which must be dissipated in order to permit efficient high power operation of the device.

Attempts have been made to assemble a plurality of such semiconductor elements in stacked relation. Although such an assembly is small in size, it has been found that it does not provide adequate dissipation of heat from all of the semiconductor elements. In such a stacked assembly of the semiconductor elements, the heat generated by the intermediate semiconductor elements in the stack must pass through the adjacent semiconductor elements in order to be dissipated from the housing which contains the semiconductor elements. This results in the poor heat dissipation from all of the semiconductor elements in the stack.

SUMMARY OF INVENTION

A semiconductor device including a plate of an electrical insulating material having an opening therethrough. A body of an electrically conductive metal is secured to one side of the plate and a terminal of an electrically conductive metal is secured to the other side of the plate. A plurality of semiconductor elements are mounted in spaced relation on the other side of the plate. The semiconductor elements are electrically connected between the metal body and the terminal.

DETAILED DESCRIPTION

Figure 1:
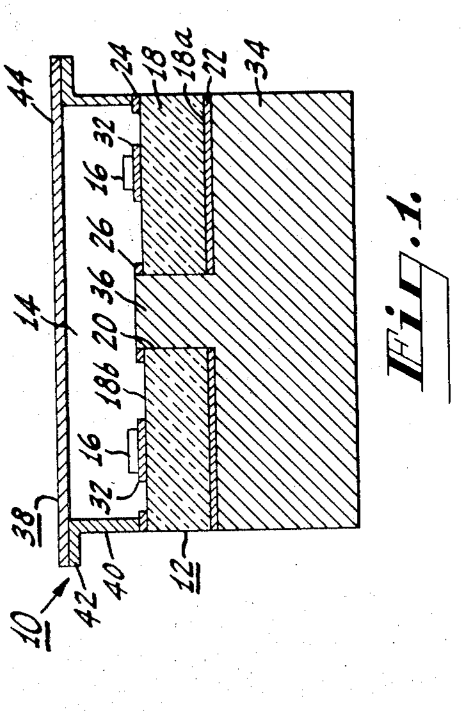
FIG. 1 is a sectional view of one form of the semiconductor device of the present invention.
Figure 2:
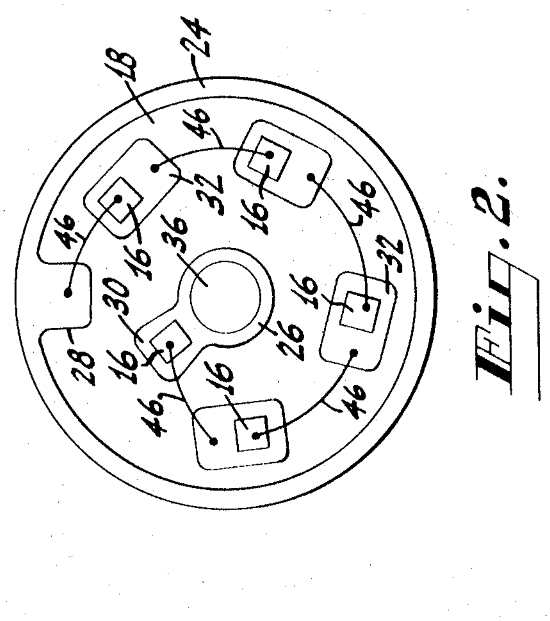
FIG. 2 is a top view of the semiconductor device of FIG. 1 with the cover removed.

Referring to FIGS. 1 and 2, one form of the semiconductor device of the present invention is generally designated as 10. The semiconductor device 10 comprises a housing, generally designated as 12, having an enclosed chamber 14 therein, and a plurality of semiconductor elements 16 mounted in spaced relation within the chamber 14 and electrically connected in series.

The housing 12 comprises a flat, circular plate 18 of an electrical insulating material which preferably is also a good conductor of heat, such as beryllium oxide, aluminum oxide, silicon nitride. Although the size of the plate 18 will depend on the number of semiconductor elements to be mounted thereon, it can be as small as 0.375 inches in diameter and 0.06 inches in thickness. The plate 18 has a central circular opening 20 therethrough. One surface **18*a* of the plate 18, hereinafter referred to as the "bottom surface," is coated with the thin film 22 of an electrically conductive metal, such as silver, paladium, gold, chromium or alloys of such metals. On the other surface 18*b* of the plate 18, hereinafter referred to as the "top surface," are a pair of narrow, annular bands 24 and 26 of a film of an electrically conductive metal, such as silver, paladium, gold, chromium or alloys of such metal, with the band 24 extending around the outer edge of the plate 18 and the band 26 extending around the edge of the opening 20. As shown in FIG. 2, band 24 includes an enlarged pad area 28 which extends radially inwardly over the top surface 18*b* and the band 26 includes an enlarged pad area 50 which extends radially outwardly over the surface 18*b*. Also, on the top surface 18*b* are a plurality of pad areas 32 of films of an electrically conductive metal. The pad areas 32 are arranged in spaced relation around the top surface 18*b* between the bands 24 and 26. Although four pad areas 32 are shown, the number of the pad areas 32 may vary depending on the number of semiconductor elements 16 to be included in the semiconductor elements 16 to be included in the semiconductor device 10.**

A flat, circular body 34 of an electrically conductive metal, such as copper, kovar or molybdenum, is juxtaposed to the bottom surface **18*a* of the plate 18 and is secured to the metal film 22, such as by soldering or brazing. The body 34 is of the same diameter as the plate 18 and is of a thickness of approximately 0.2 inches. The body 34 has a central, circular projection 36 which is of the same diameter as and extends through the opening 20 in the plate 18. The projection 36 is of a length to extend to the top surface 18*b* of the plate 18 and is electrically connected to the metal film band 26,** such as soldering or by a wire secured between the projection and the band.

A cover, generally designated as 38 of an electrically conductive metal, such as copper, kovar or molybdenum, is mounted on the top surface **18*b* of the plate 18. The cover 38 comprises a thin, cylindrical wall 40 having a radially outwardly extending flange 42 at its upper end. The cylindrical wall 40 has an outer diameter equal to the diameter of the plate 18 and is of a height of approximately 0.060 inches. The wall 40 is seated on and secured to the metal film band 24, such as by soldering or brazing. A thin circular cover plate 44 extends across the top end of the cylindrical wall 40 and is seated on the flange 42. The cover plate 44 is secured to the flange 42, such as by soldering, brazing or welding. Thus, the chamber 14 is provided between the cover 38 and the plate 18. Although the cover 38** is shown to be made of two pieces, it can be made as a single piece.

A plurality of the semiconductor elements 16 are provided in the chamber 14 with each of the semiconductor elements 16 being mounted on a separate one of the pad areas 32 and with one of the semiconductor elements being mounted on the pad area 30. The semiconductor elements 16 are preferably diodes of a type which operate at high power and which, during operation, generate heat which must be dissipated. Although the semiconductor elements 16 can be of any well-known diode construction, in general, each of the semiconductor elements comprises a small body of a semiconductor material, such as silicon, germanium or a group III–V semiconductor compound, having contiguous regions of P-type conductivity and N-type conductivity forming a PN junction therebetween, and contacts on opposed surfaces of the body in ohmic contact with the regions. Each of the semiconductor elements 16 is mounted on its respective pad area 32 or 30 with one of its contacts being secured to the pad area, such as by an electrically conductive solder, so as to be electrically connected to the pad area. A separate wire 46 of an electrically conductive metal, such as gold or aluminum, is secured at one end of the other contact of each of the semiconductor elements 16 and at its other end to the pad area which is next adjacent pad area on which respective semiconductor element is mounted. As shown in FIG. 2, one of the wires 46 is connected to the pad area 28 extending from the metal film band 24. Thus, each of the semiconductor elements 16 is electrically connected between two adjacent pad areas and all of the semiconductor elements are electrically connected in series between the inner metal film band 26 and the outer metal film band 24. Since the cover 38 and the metal body 34 are electrically connected to the metal film bands 24 and 26 respectively, they provide the terminals for the semiconductor device 10.

Since the semiconductor device 10 includes a plurality of semiconductor elements electrically connected in series, the semiconductor device is capable of operating at powers greater than the power operating capability of each of the individual semiconductor elements by a factor equal to the number of semiconductor elements in the device. During the operation of the semiconductor device 10, the current passing through the semiconductor elements 16 causes each of the semiconductor elements to generate heat. Since each of the semiconductor elements is individually mounted on the plate 18, the heat generated in each of the semiconductor elements is conducted directly to the plate 18 without passing through any of the other semiconductor elements. Since the plate 18 and the body 34 are large as compared to the size of the semiconductor elements and are of good heat conductivity material, the heat generated in each of the semiconductor elements is rapidly conducted away from the semiconductor elements and dissipated into the surrounding atmosphere. Thus, the semiconductor elements 16 are maintained at a temperature which permits efficient operation of the semiconductor device at its high power operating capabilities.

Figure 3:
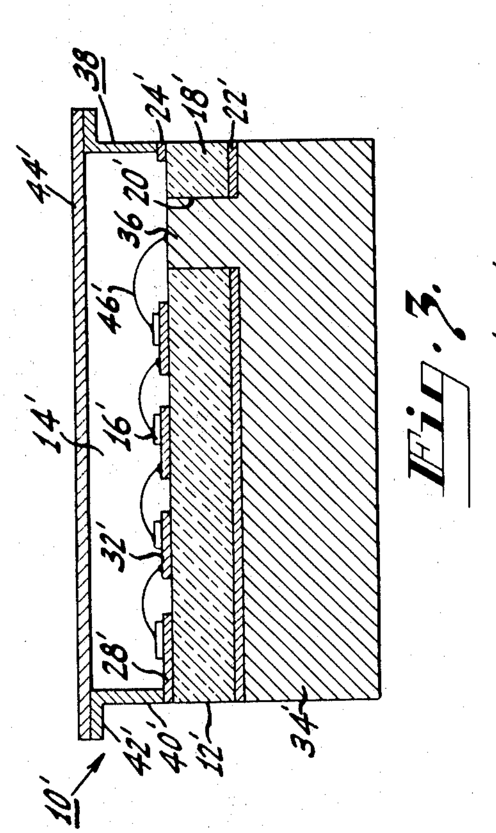
FIG. 3 is a sectional view of another form of the semiconductor device of the present invention.
Figure 4:
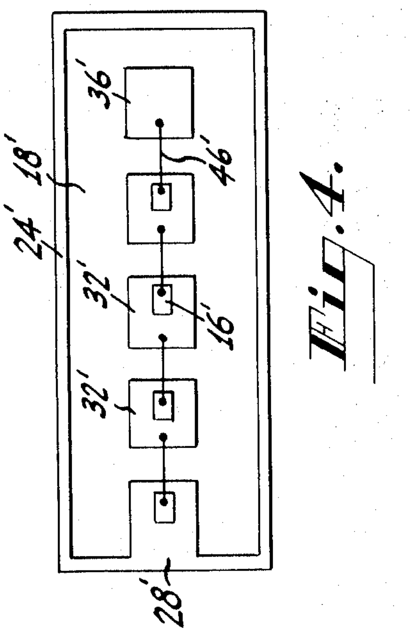
FIG. 4 is a top view of the semiconductor device of FIG. 3 with the cover removed.

Referring to FIGS. 3 and 4, another form of the semiconductor device of the present invention is generally designated as 10'. The semiconductor device 10' comprises a housing, generally designated as 12', having an enclosed chamber 14' therein, and a plurality of semiconductor elements 16' mounted in spaced relation within the chamber 14' and electrically connected in series.

The housing 12' comprises a flat, rectangular plate 18' of an electrical insulating material which preferably is also a good conductor of heat, such as beryllium oxide, aluminum oxide or silicon nitride. The plate 18' has a square opening 20' therethrough adjacent one end thereof. The bottom surface of the plate 18' is coated with a thin film 22' of an electrically conductive metal, such as silver, paladium, gold, chromium, or alloys of such metals. On the top surface of the plate 18' a narrow band 24' of a film of an electrically conductive metal, such as silver, paladium, gold, chromium or alloys of such metals which extends around the edge of the plate 18'. As shown in FIG. 4, the metal film band 24' includes an enlarged pad area 28' which extends over the top surface of the plate 18' at the end of the plate away from the opening 20'. Also on the top surface of the plate 18' are a plurality of pad areas 32' of an electrically conductive metal. The pad areas 32' are arranged in aligned, spaced relation between the pad area 28' and the opening 20'. Although three areas 32' are shown, the number of the pad areas may vary depending on the number of semiconductor elements 16' to be included in the semiconductor device 10'.

A flat, rectangular body 34' of an electrically conductive metal, such as copper, kovar or molybdenum, is juxtaposed to the bottom surface of the plate 18' and is secured to the metal film 20', such as by soldering or brazing. The body 34' is of the same shape and size as the plate 18' and is of a thickness of approximately 0.2 inches. The body 34' has a projection 36' of the same shape and size as the opening 20' in the plate 18' and which extends through the opening 20'. The projection 36' is of a length to extend to the top surface of the plate 18'.

A cover, generally designated as 38', of an electrically conductive metal, such as copper, kovar, or molybdenum, is mounted on the top surface of the plate 18'. The cover 38' comprises a thin, rectangular wall 40' having an outwardly extending flange 42' at its upper end. The rectangular wall 40' is of a transverse shape and size corresponding to the shape and size of the plate 18' and of a height of approximately 0.060 inches. The wall 40' is seated on and secured to the metal film band 24', such as by soldering or brazing. A thin, rectangular cover plate 44' extends across the top end of the wall 40' and is seated on the flange 42'. The cover plate 44' is secured to the flange 42', such as by soldering, brazing or welding. Thus, the chamber 14' is provided between the cover 38' and the plate 18'.

A plurality of the semiconductor elements 16' are provided in the chamber 14' with each of the semiconductor elements 16' being mounted on a separate one of the pad areas 32' and with one of the semiconductor elements being mounted on the pad area 28'. If desired, a semiconductor element can be mounted on the projection 36' of the body 34'.

The semiconductor elements 16' are of the same type as the semiconductor elements 16 previously described with regard to the semiconductor device 10 of FIGS. 1 and 2. Each of the semiconductor element 16 is mounted on its respective pad area 32' or 28' with one of its contacts being secured to the pad, such as by an electrically conductive solder, so as to be electrically connected to the pad area. A separate wire 46' of an electrically conductive metal, such as gold or aluminum, is secured at one end of the other contact of each of the semiconductor elements 16' and at its other end to the pad area which is next adjacent the pad area on which the respective semiconductor element is mounted. One of the wires 46' is connected to the projection 36' of the body 34'. Thus, the semiconductor devices 16' are all electrically connected in series between the cover 38' which is electrically connected to the metal film band 24', and the metal body 34', which provide the terminals for the semiconductor device 10'.

The semiconductor device 10' operates in the same manner as the semiconductor device 10 previously described. When the current passes through the semiconductor elements 16', the heat generated by each of the semiconductor elements is conducted directly to the plate 18'. The plate 18' conducts the heat away from the semiconductor elements 16' and dissipates the heat with the surrounding atmosphere either directly or through the metal body 34'. Thus, the semiconductor elements 16' are maintained at a temperature which permits efficient operation of the semiconductor device 10' at its high power operating capabilities.

We claim:

1. A semiconductor device comprising
   a. a flat plate of an electrical insulating and thermally conductive material having a pair of opposed major sides and an opening therethrough extending between said sides,
   b. a body of an electrically conductive metal secured to one side of said plate and having a projection extending through the opening in the plate,
   c. a cover of an electrically conductive metal secured to the other side of the plate and forming an enclosed chamber between the cover and the plate,
   d. a plurality of semiconductor elements mounted in spaced relation on the other side of the plate and within the chamber so that each semiconductor element is thermally connected to said plate, and
   e. means electrically connecting the semiconductor elements in series between the projection of the metal body and the cover.

2. A semiconductor device in accordance with claim 1 including a plurality of pad areas on the other side of the plate, each of said pad areas being a film of an electrically conductive metal coated on the other side of the plate, and the semiconductor elements are mounted on and electrically connected to the pad areas.

3. A semiconductor device in accordance with claim 2 including a separate wire electrically connecting each of the semiconductor elements to the pad area adjacent the pad area on which the semiconductor element is mounted.

4. A semiconductor device in accordance with claim 3 including a narrow band of a film of an electrically conductive metal on the other surface of the plate and extending around the outer edge of the plate, and the cover is seated on and secured to the narrow band.

5. A semiconductor device in accordance with claim 4 in which the cover includes an outer wall seated on the narrow band and from the other surface of the plate and a cover plate extending across and secured to the free end of the outer wall.

6. A semiconductor device in accordance with claim 5 in which the plate is circular and has a central opening therethrough, the projection of the body extends through the central opening, and the pad areas are arranged in spaced relation around the central opening.

7. A semiconductor device in accordance with claim 6 including a second narrow band of a film of an electrically conductive metal on the other surface of the plate and extending around the edge of the control opening, said second band being electrically connected to the projection of the body, and separate metal film pad area on the other surface of the plate extending from each of the narrow bands.

8. A semiconductor device in accordance with claim 4 in which the plate is rectangular and has an opening therethrough adjacent one end thereof, the projection of the body extends through the opening, and the pad areas are arranged on the other surface of the plate in spaced relation between the spacing and the other end of the plate.

* * * * *

UNITED STATES PATENT OFFICE
CERTIFICATE OF CORRECTION

Patent No. 3,619,734 Dated November 9, 1971

Inventor(s) Jacques Mayer Assour & Arye Rosen

It is certified that error appears in the above-identified patent and that said Letters Patent are hereby corrected as shown below:

Column 2, line 8, change "50" to --30--.

Column 2, line 15, delete "semiconductor elements 16 to be included in the".

Column 2, line 68, after "adjacent" insert --the--.

Signed and sealed this 11th day of April 1972.

(SEAL)
Attest:

EDWARD M.FLETCHER,JR.
Attesting Officer

ROBERT GOTTSCHALK
Commissioner of Patents